(12) United States Patent
Fang et al.

(10) Patent No.: US 9,704,998 B2
(45) Date of Patent: Jul. 11, 2017

(54) THIN FILM TRANSISTOR AND METHOD OF MANUFACTURING THE SAME, DISPLAY SUBSTRATE, AND DISPLAY APPARATUS

(71) Applicant: BOE TECHNOLOGY GROUP CO., LTD., Beijing (CN)

(72) Inventors: Jingfei Fang, Beijing (CN); Chunsheng Jiang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/653,134

(22) PCT Filed: Aug. 19, 2014

(86) PCT No.: PCT/CN2014/084703
§ 371 (c)(1),
(2) Date: Jun. 17, 2015

(87) PCT Pub. No.: WO2015/165174
PCT Pub. Date: Nov. 5, 2015

(65) Prior Publication Data
US 2016/0300955 A1   Oct. 13, 2016

(30) Foreign Application Priority Data
Apr. 28, 2014   (CN) .......................... 2014 1 0174331

(51) Int. Cl.
*H01L 29/786* (2006.01)
*H01L 21/477* (2006.01)
(Continued)

(52) U.S. Cl.
CPC ...... *H01L 29/78618* (2013.01); *H01L 21/477* (2013.01); *H01L 27/127* (2013.01);
(Continued)

(58) Field of Classification Search
CPC .................. H01L 29/78618; H01L 21/477
(Continued)

(56) References Cited

U.S. PATENT DOCUMENTS 6,797,388 B1 * 9/2004 Szanyi ................ C03C 17/3417
427/164
7,199,985 B1 * 4/2007 Sato ...................... B82Y 10/00
360/324.2
(Continued)

FOREIGN PATENT DOCUMENTS

| CN | 101950733 A | 1/2011 |
|---|---|---|
| CN | 102651401 A | 8/2012 |

(Continued)

OTHER PUBLICATIONS

First Office Action from Chinese Patent Application No. 201410174331.7, dated Dec. 12, 2014, 7 pages.
(Continued)

*Primary Examiner* — Ori Nadav
(74) *Attorney, Agent, or Firm* — Kinney & Lange, P.A.

(57) ABSTRACT

The present invention discloses a thin film transistor, a method of manufacturing the thin film transistor, a display substrate and a display apparatus. The method comprising steps of: forming an active material layer on a substrate; forming an etch barrier material layer on the active material layer, wherein the etch barrier material layer being made of a conductive material capable of blocking a source and drain etching liquid; forming an active layer pattern and an initial etch barrier layer pattern by performing a single patterning process on the active material layer and the etch barrier material layer, wherein the initial etch barrier layer pattern comprising a first region, a second region and a third region, the first region and the third region being regions for forming a source and a drain, respectively, the second region being a region of the initial etch barrier layer pattern except the (Continued)

first and third regions; forming the source and the drain in the first region and the third region, respectively, by a patterning process; converting the conductive material in the second region of the initial etch barrier layer pattern into an insulation material by an annealing process, so as to form an etch barrier layer.

8 Claims, 6 Drawing Sheets

(51) Int. Cl.
    H01L 27/12        (2006.01)
    H01L 29/24        (2006.01)
    H01L 29/66        (2006.01)
(52) U.S. Cl.
    CPC .......... *H01L 27/1225* (2013.01); *H01L 29/24* (2013.01); *H01L 29/66969* (2013.01); *H01L 29/786* (2013.01); *H01L 29/7869* (2013.01); *H01L 29/78696* (2013.01)
(58) Field of Classification Search
    USPC ...... 257/43, 59, 66, 102, 103; 438/149, 166, 438/530
    See application file for complete search history.

(56) References Cited

U.S. PATENT DOCUMENTS

| | | | | |
|---|---|---|---|---|
| 7,221,547 B2* | 5/2007 | Zhang | ............... | B82Y 10/00 257/E43.004 |
| 7,824,952 B2* | 11/2010 | Choi | ............... | H01L 27/1229 257/40 |
| 8,389,988 B2* | 3/2013 | Yamazaki | ........... | H01L 27/0248 257/102 |
| 8,435,891 B2* | 5/2013 | Engel | ............... | H01L 21/31144 257/E21.158 |
| 8,878,185 B2* | 11/2014 | Ishigaki | ............... | H01L 33/08 257/40 |
| 2007/0235793 A1 | 10/2007 | Yamazaki et al. | | |
| 2008/0296568 A1* | 12/2008 | Ryu | ............... | H01L 21/02554 257/43 |
| 2011/0193076 A1* | 8/2011 | Yun | ............... | H01L 27/1214 257/43 |
| 2012/0256176 A1* | 10/2012 | Yang | ............... | H01L 29/41733 257/43 |
| 2014/0077203 A1* | 3/2014 | Yuan | ............... | H01L 29/7869 257/43 |

FOREIGN PATENT DOCUMENTS

| | | |
|---|---|---|
| CN | 103500738 A | 1/2014 |
| CN | 103972299 A | 8/2014 |

OTHER PUBLICATIONS

International Search Report and Written Opinion dated Jan. 12, 2015, for corresponding PCT Application No. PCT/CN2014/084703.

English Translation of Written Opinion dated Jan. 12, 2015, for corresponding PCT Application No. PCT/CN2014/084703.

* cited by examiner

THIN FILM TRANSISTOR AND METHOD OF MANUFACTURING THE SAME, DISPLAY SUBSTRATE, AND DISPLAY APPARATUS

BACKGROUND OF THE INVENTION

Field of the Invention

Embodiments of the present invention relates to display technical field, more particularly, relates to a thin film transistor and a method of manufacturing the thin film transistor, a display substrate and a display apparatus.

Description of the Related Art

Both an oxide thin film transistor (TFT) and an amorphous silicon TFT may be used as a driving tube in a display panel, such as, an organic light-emitting diode (OLED) panel, a polymer light-emitting diode (PLED) panel, etc. The oxide TFT has a current carrier concentration which is many times higher than that of the amorphous silicon TFT. In addition, since the oxide TFT may be manufactured by magnetron sputtering process, it does not need to substantially change the existing liquid crystal display panel production line. Also, since there is no restriction in the equipments for implementing ion implantation and laser crystallization, the oxide TFT is more favorable for the production of a large area display panel.

FIGS. 1(a)-1(c) show a flow chart of manufacturing an oxide TFT in the prior art. As shown in FIGS. 1(a)-1(c), for instance, the oxide TFT is configured to have a top gate configuration and use indium gallium zinc oxide (IGZO). Hereafter, it will describe a method of manufacturing the oxide TFT with an active layer made of the indium gallium zinc oxide in the prior art, the method comprises following steps of:

depositing a buffer layer 101 on a glass substrate; depositing an IGZO oxide semiconductor material layer on the buffer layer 101; forming an active layer pattern 102 by a patterning process; depositing a silicon oxide (SiOx) on the active layer pattern to form an etch barrier layer; etching the etch barrier layer to form an etch barrier layer pattern 103 as shown in Fig. (b), of course, the etch barrier layer pattern in the prior art may also comprise via holes corresponding to a source and a drain, respectively; and depositing a source and drain layer to form the source and the drain 104.

In the above method of manufacturing the thin film transistor in the prior art, the active layer is made of oxide semiconductor material. The oxide semiconductor material is very sensitive to a source and drain etching liquid. Thereby, in order to protect the active layer from the source and drain etching liquid during etching a metal layer to form the source and the drain, it is necessary to form an etch barrier layer on the active layer. Generally, it needs to perform a special patterning process on the etch barrier layer, which makes the production process of the oxide TFT complicated and results in a long production time and a high production cost.

SUMMARY OF THE INVENTION

Embodiments of the present invention have been made to overcome or alleviate at least one aspect of the above mentioned disadvantages.

Embodiments of the present invention provide a thin film transistor, a method of manufacturing the thin film transistor, a display substrate and a display apparatus, which can simplify the production process and reduce the production cost of a thin film transistor, a display substrate and a display apparatus.

According to an aspect of the present invention, there is provided a method of manufacturing a thin film transistor, comprising steps of:

forming an active material layer on a substrate;

forming an etch barrier material layer on the active material layer, wherein the etch barrier material layer being made of a conductive material capable of blocking a source and drain etching liquid;

forming an active layer pattern and an initial etch barrier layer pattern by performing a single patterning process on the active material layer and the etch barrier material layer, wherein the initial etch barrier layer pattern comprising a first region, a second region and a third region, the first region and the third region being regions for forming a source and a drain, respectively, the second region being a region of the initial etch barrier layer pattern except the first and third regions;

forming the source and the drain in the first region and the third region, respectively, by a patterning process;

converting the conductive material in the second region of the initial etch barrier layer pattern into an insulation material by annealing, so as to form an etch barrier layer pattern.

In an embodiment, the source and the drain are further formed on at least a portion of side surfaces of the active layer pattern and the initial etch barrier layer pattern.

In an embodiment, the etch barrier material layer is made of a metal material capable of blocking the source and drain etching liquid, and the metal material in the second region is converted into a metallic oxide after the annealing.

In an embodiment, the etch barrier material layer is made of Tin, and the Tin in the second region is converted into a Tin oxide after the annealing.

In an embodiment, the annealing is performed in the air at a temperature of 200-250° C. for 0.5-3 hours.

In an embodiment, the thin film transistor is configured to have a top gate structure, and the method further comprising: forming a buffer layer on the substrate before forming the active material layer; and forming a gate insulation layer and a gate electrode after forming the source and the drain.

In an embodiment, the thin film transistor is configured to have a bottom gate structure, and the method further comprising: forming a gate electrode and a gate insulation layer on the substrate before forming the active material layer.

In an embodiment, the active material layer is made of an oxide semiconductor material.

According to another aspect of the present invention, there is provided a thin film transistor, comprising: an active layer, an etch barrier layer, and a source and a drain; wherein the etch barrier layer is located on an upper surface of the active layer and comprises a first region, a second region and a third region; wherein the etch barrier layer in the first region and the third region contains a conductive material capable of blocking a source and drain etching liquid, and the etch barrier layer in the second region contains an insulation material formed by the conductive material; and wherein the source and the drain are located in the first region and the third region of the etch barrier layer, respectively, and the second region is a region of the etch barrier layer except the first and third regions.

In an embodiment, the insulating material is converted from the conductive material by annealing the conductive material.

In an embodiment, the conductive material comprises a metal material, and the insulation material is a metallic oxide converted from the metal material.

In an embodiment, the metal material comprises Tin, and the metallic oxide comprises Tin oxide.

In an embodiment, the source and the drain contact at least a portion of side surfaces of the active layer and the etch barrier layer.

In an embodiment, the active layer comprises an oxide semiconductor.

In an embodiment, the thin film transistor further comprising: a buffer layer located below the active layer; a gate insulation layer located above the source and the drain; and a gate electrode located above the gate insulation layer.

In an embodiment, the thin film transistor further comprising: a gate insulation layer located below the active layer; and a gate electrode located below the gate insulation layer.

Embodiments of the present invention may have the following advantages: according to embodiments of the present invention, the etch barrier material layer is made of the conductive material capable of blocking the source and drain etching liquid, the etch barrier layer and the active layer are formed by a single patterning process, and the conductive material in the second region (including a gap between the source and the drain) is converted into the insulation material by annealing after forming the source and the drain, so as to prevent a short circuit between the source and the drain, achieving the role of a conventional etch barrier layer. Compared with the prior art, it omits a step of individually forming the etch barrier layer by patterning process, simplifying the entire production process, reducing the manufacturing procedures, and saving the production cost. Furthermore, the conductive material below the source and the drain is not changed during the annealing, which improves a contact resistance between the active layer and the source and the drain of the thin film transistor, and increases the driving capability of the thin film transistor.

DETAILED DESCRIPTION OF PREFERRED EMBODIMENTS OF THE INVENTION

The above and other features of the present invention will become more apparent by describing in detail exemplary embodiments thereof with reference to the accompanying drawings.

Figure 1:
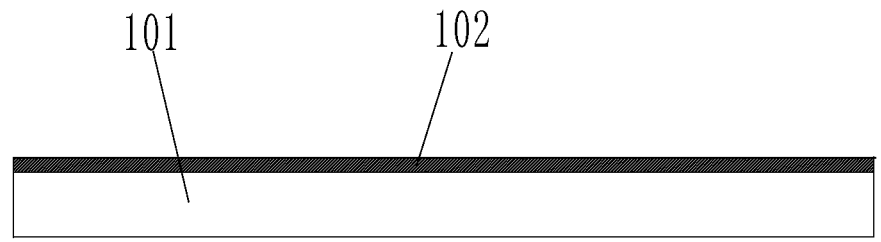
FIGS. 1(a)-1(c) show a flow chart of manufacturing an oxide TFT in the prior art.
Figure 1:
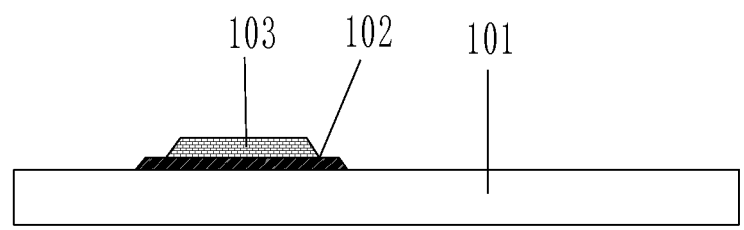
Figure 1:
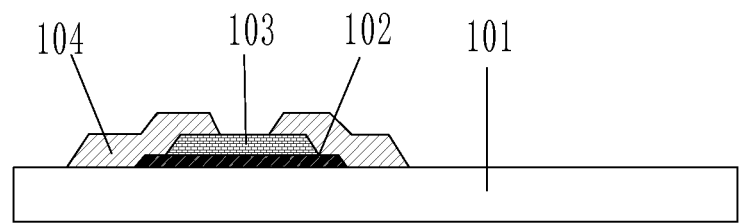
Figure 2:
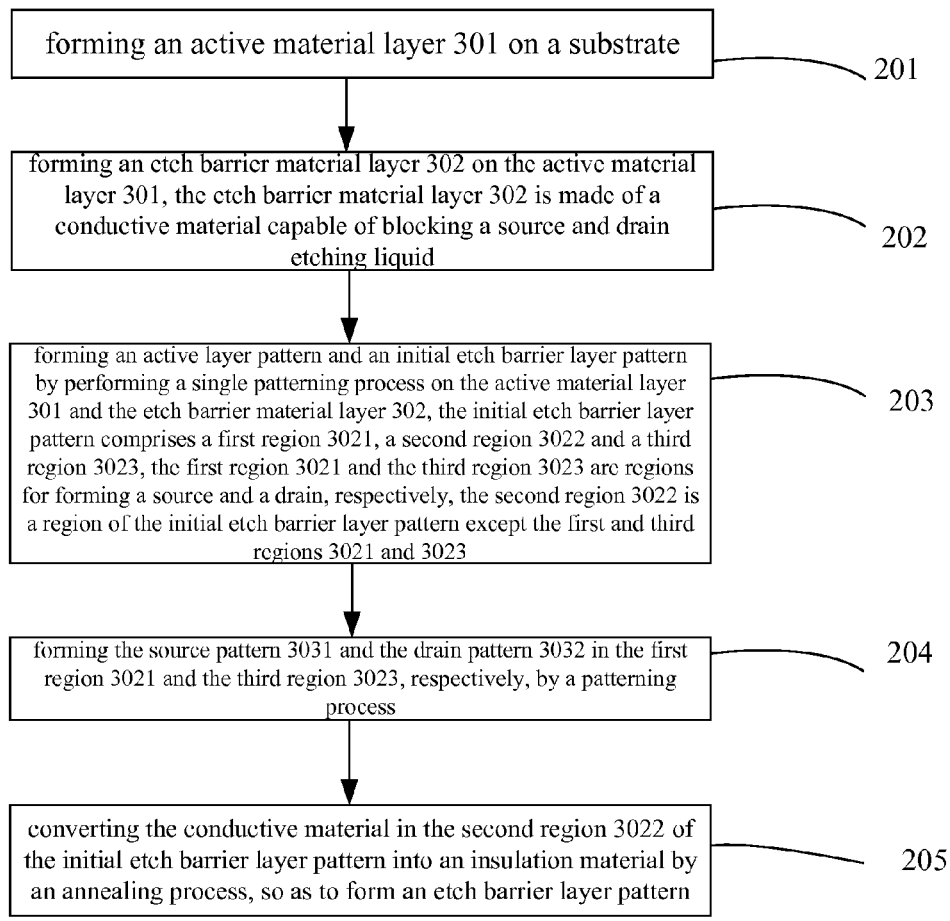
FIG. 2 is a flow chart of a method of manufacturing a TFT according to an exemplary embodiment of the present invention.

FIG. 2 is a flow chart of a method of manufacturing a TFT according to an exemplary embodiment of the present invention; FIGS. 3(a)-3(d) show steps of manufacturing a TFT according to an exemplary embodiment of the present invention.

As shown in FIGS. 2 and 3(a)-3(d), the method comprises the following steps.

Step 201: forming an active material layer 301 on a substrate;

In an embodiment, the active material layer may be made of an oxide semiconductor material, for example, Indium Gallium Zinc Oxide (IGZO) or the like.

Figure 3:
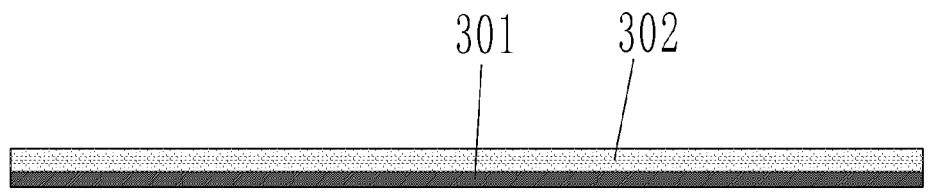
FIGS. 3(a)-3(d) show steps of manufacturing a TFT according to an exemplary embodiment of the present invention.
Figure 3:
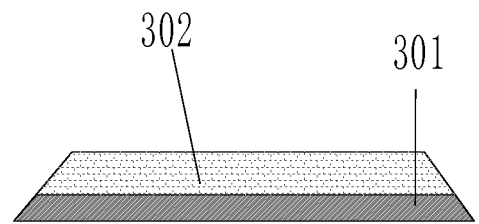
Figure 3:
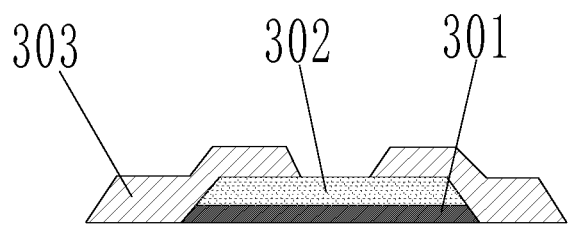
Figure 3:
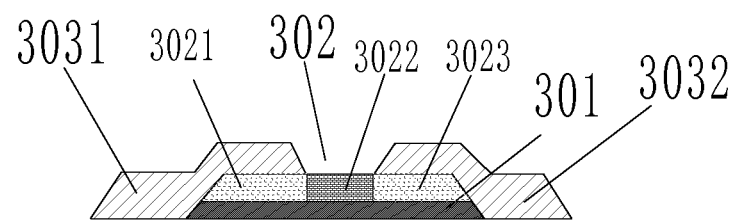

Step 202: forming an etch barrier material layer 302 on the active material layer 301, as shown in FIG. 3(a), the etch barrier material layer 302 is made of a conductive material capable of blocking a source and drain etching liquid;

Step 203: forming an active layer pattern and an initial etch barrier layer pattern by performing a single patterning process on the active material layer 301 and the etch barrier material layer 302, as shown in FIG. 3(b), the initial etch barrier layer pattern comprises a first region 3021, a second region 3022 and a third region 3023, the first region 3021 and the third region 3023 are regions for forming a source and a drain, respectively, the second region 3022 is a region of the initial etch barrier layer pattern except the first and third regions 3021 and 3023, that is, a gap region between the source and the drain. It should be appreciated that the first region, the second region and the third region of the initial etch barrier layer are divided based on structural features of respective different positions of a final etch barrier layer pattern. The difference between the initial etch barrier layer and the etch barrier layer is in that the material in the second region is changed after the annealing. Thereby, when forming the initial etch barrier layer pattern, there is no difference in constituent material for the three regions of the initial etch barrier layer pattern. The positions corresponding to the three regions of the initial etch barrier layer pattern corresponds to positions of the three regions of the final etch barrier layer pattern, respectively. In order to describe more clearly and for easy understanding, the three regions of the initial etch barrier layer pattern are shown in the final etch barrier layer pattern, as shown in FIG. 3(d).

Step 204: forming the source 3031 and the drain 3032 in the first region 3021 and the third region 3023, respectively, by a patterning process;

Also, the source and the drain are further formed on at least a portion of side surfaces of the active layer and the initial etch barrier layer pattern. The source and the drain contact the active layer through the at least a portion of side surfaces, enhancing the electrical connection between the active layer and the source and the drain.

Step 205: converting the conductive material in the second region 3022 of the initial etch barrier layer pattern into an insulation material by an annealing process, so as to form an etch barrier layer pattern, as shown in FIG. 3(d).

In an embodiment, the conductive material comprises a metal material, for example, Tin. The metal material in the second region 3022 is oxidized to form an insulation metallic oxide, for example, Tin oxide, after the annealing. The metal Tin (Sn) is not sensitive to the source and drain etching liquid, if the etch barrier layer is made of tin, the etch barrier layer may protect the active layer from the source and drain etching liquid. Furthermore, during the annealing, the tin exposed to the annealing environment may be converted into an insulation tin oxide (SnOx), which may prevent the short circuit between the source and the drain, meeting the basic requirements of the thin film transistor.

In an embodiment, the annealing is performed in the air at a temperature of 200-250° C. for 0.5-3 hours. In such annealing conditions, the conductive material in the second region, exposed to the annealing environment, is converted into an insulation material, which can prevent the short circuit between the source and the drain, and meeting the basic requirements of the thin film transistor.

In an embodiment, forming an active layer pattern and an initial etch barrier layer pattern by performing a single patterning process on the active material layer and the etch barrier material layer comprises following steps of:

Step 2031: coating a layer of photoresist on the etch barrier material layer;

Step 2032: using the oxide active layer mask to expose the photoresist and develop the photoresist, and etching the active material layer and the etch barrier material layer to form the active layer pattern and the initial etch barrier layer pattern.

In another embodiment, in a method of manufacturing the thin film transistor with the top gate structure, the method further comprises: forming a buffer layer on the substrate before forming the active material layer 301; and forming a gate insulation layer and a gate electrode after forming the source 3031 and the drain 3032.

In another embodiment, as for the thin film transistor with the bottom gate structure, the method further comprises: forming a gate electrode and a gate insulation layer in this order on the substrate before forming the active material layer 301.

Hereafter, it will describe in detail a solution of the present invention by taking the thin film transistor with the top gate structure as an example.

Figure 4:
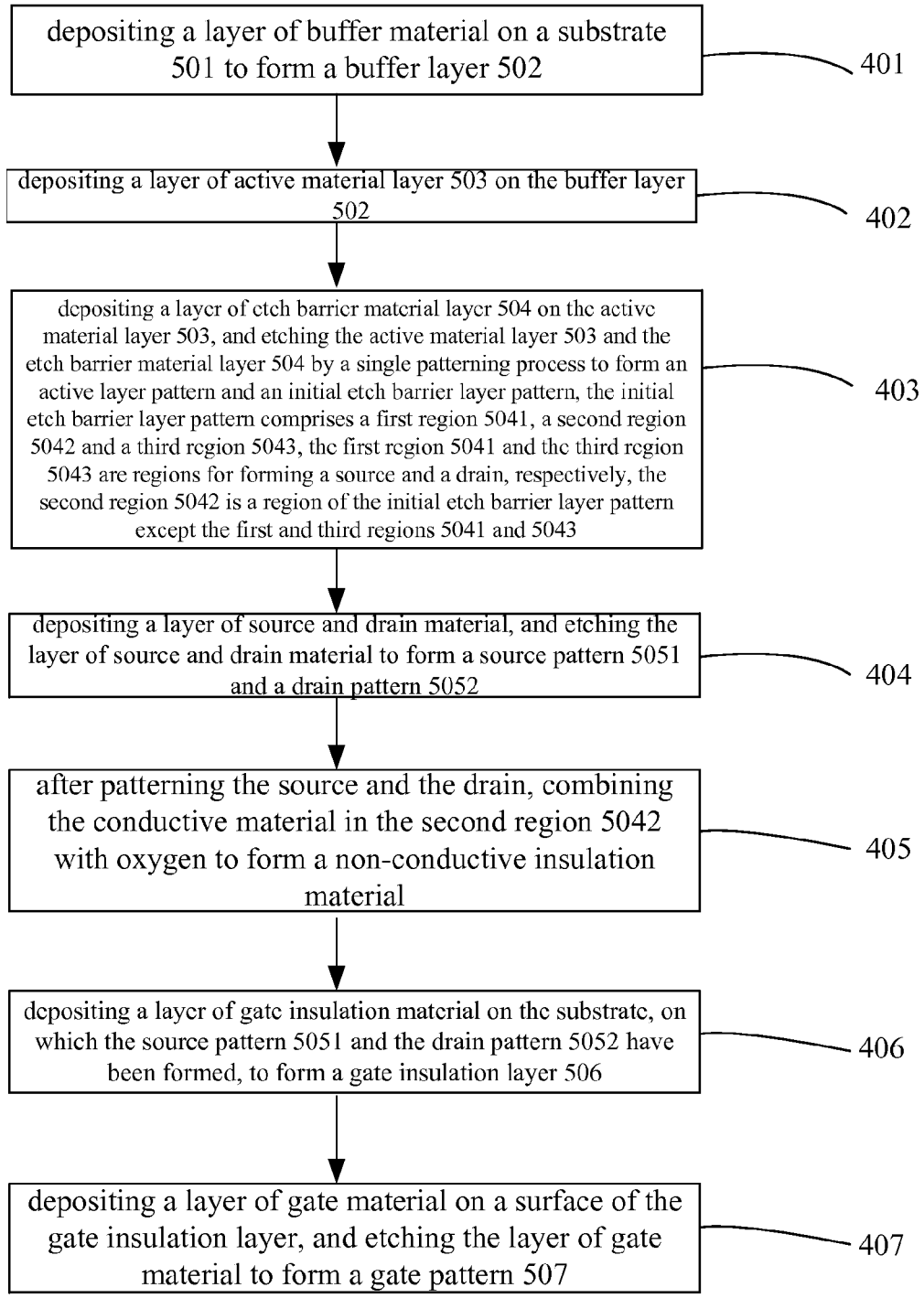
FIG. 4 is a flow chart of a method of manufacturing a TFT according to an exemplary embodiment of the present invention.
Figure 5:
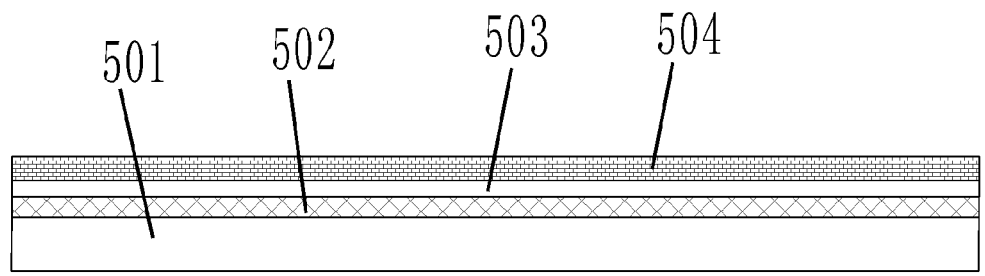
FIGS. 5(a)-5(e) show steps of manufacturing a TFT according to an exemplary embodiment of the present invention.
Figure 5:
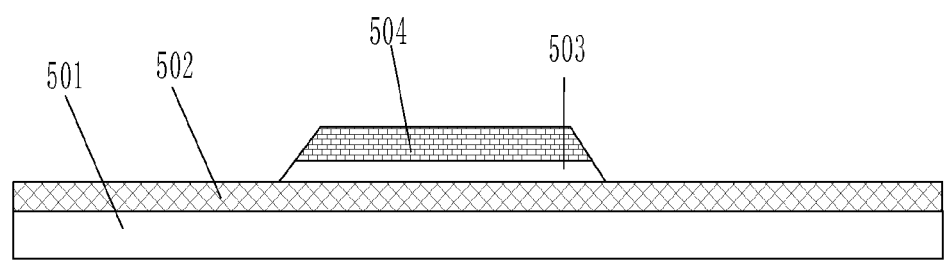
Figure 5:
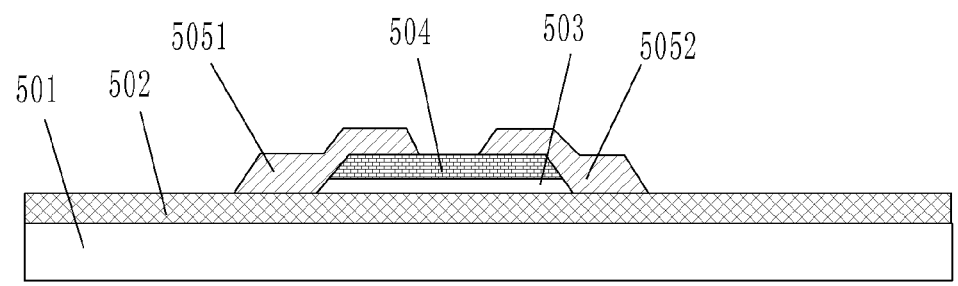
Figure 5:
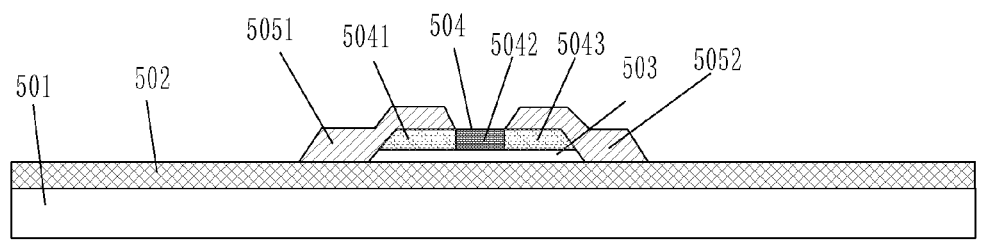
Figure 5:
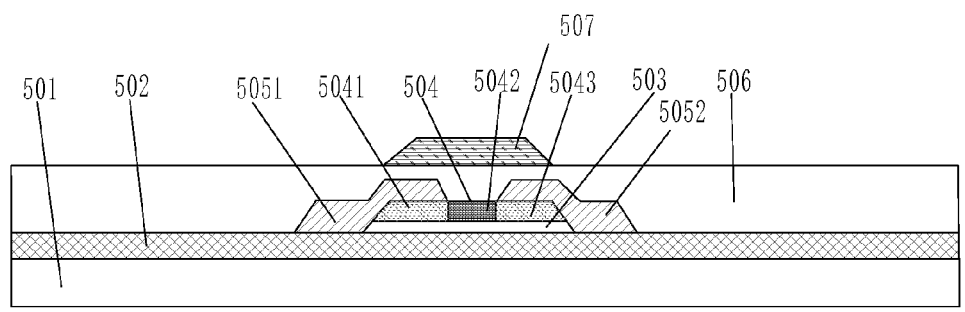

FIG. 4 is a flow chart of a method of manufacturing a TFT according to an exemplary embodiment of the present invention; FIGS. 5(*a*)-5(*e*) show steps of manufacturing a TFT according to an exemplary embodiment of the present invention. As shown in FIGS. 4 and 5(*a*)-5(*e*), the method comprises the following steps.

Step 401: depositing a layer of buffer material on a substrate 501 to form a buffer layer 502, as shown in FIG. 5(*a*). The buffer layer is used to block the diffusion of small and medium molecules in the substrate so as to protect the active layer from being influenced by the diffusion of small molecules. The buffer layer may be made of silicon oxide, silicon nitride, etc.

In an embodiment, the substrate 501 may be made of glass, silicon, quartz, plastic and silicon base plate.

Step 402: depositing a layer of active material layer 503 on the buffer layer 502;

In an embodiment, the active material layer may comprise oxide semiconductor, for example, Indium Gallium Zinc Oxide (IGZO) or the like.

Step 403: depositing a layer of etch barrier material layer 504 on the active material layer 503, as shown in FIG. 5(*a*); and etching the active material layer 503 and the etch barrier material layer 504 by a single patterning process to form an active layer pattern and an initial etch barrier layer pattern, as shown in FIG. 5(*b*). The initial etch barrier layer pattern comprises a first region 5041, a second region 5042 and a third region 5043, the first region 5041 and the third region 5043 are regions for forming a source and a drain, respectively; the second region 5042 is a region of the initial etch barrier layer pattern except the first and third regions 5041 and 5043, and the second region 5042 comprises a gap between the source and the drain. The etch barrier material layer may be made of a conductive material capable of blocking a source and drain etching liquid. In the subsequent annealing process, the conductive material in the second region is combined with oxygen to form a non-conductive insulation material, which may prevent a short circuit between the source and the drain. The conductive material capable of blocking the source and drain etching liquid comprises metal material. In this embodiment, the etch barrier layer is made of metal Tin (Sn). The metal Tin (Sn) is not sensitive to the source and drain etching liquid. If the etch barrier layer is made of tin, the etch barrier layer may protect the active layer from the source and drain etching liquid. Furthermore, during the annealing process, the tin exposed to the annealing environment may be converted into an insulation tin oxide (SnOx), which may prevent the short circuit between the source and the drain, meeting the basic requirements of the thin film transistor. However, the present invention is not restrictive for the material of the etch barrier layer. Any other conductive material capable of blocking the source and drain etching liquid and being converted into the insulation material in the subsequent annealing also falls within the scope of the present invention.

In the embodiments of the present invention, the conductive material capable of blocking the source and drain etching liquid is used as the material of the etch barrier layer, and the active layer pattern and the etch barrier layer pattern are formed by a single patterning process. Compared with the prior art, it omits a step of individually forming the etch barrier layer by a patterning process, simplifying the entire production process, and reducing the manufacturing procedures.

In an embodiment, the etch barrier material layer 504 has a thickness of 50-150 Å, preferably, 100 Å.

In an embodiment, the single patterning process in the step 403 comprises a single patterning process performed with an oxide mask.

In an embodiment, when the single patterning process is performed with the oxide mask, the step 403 further comprises steps of:

Step 4031: coating a layer of photoresist on the etch barrier material layer;

Step 4032: using the oxide active layer mask to expose the photoresist and develop the photoresist, and etching the active material layer and the etch barrier material layer to form the active layer pattern and the initial etch barrier layer pattern.

Step 404: depositing a layer of source and drain material, and etching the layer of source and drain material to form a source pattern 5051 and a drain pattern 5052, as shown in FIG. 5(*c*).

In an embodiment, the source and drain material may be deposited by sputtering, and comprises metal and other conductive material. The metal may comprise Mo, Pt, Al, Ti, Co, Au, Cu, etc. The other conductive material may comprise doped polycrystalline silicon, such as metal nitride including TiN, TaN, etc.

In an embodiment, during manufacturing the source pattern 5051 and the drain pattern 5052, firstly, a layer of source and drain material is uniformly deposited on the substrate, on which the active layer pattern and the initial etch barrier layer pattern have been formed, by sputtering. Then, according to an electrode layout, a portion of the layer of source and drain material, that is not required, is removed by etching. After the etching, a pair of electrodes opposed to each other are left to form the source pattern 5051 and the drain pattern 5052.

Step 405: after patterning the source and the drain, combining the conductive material in the second region 5042 with oxygen to form a non-conductive insulation material by an annealing process, as shown in FIG. 5(*d*), so as to prevent the short circuit between the source and the drain, and meet the properties of the thin film transistor. Meanwhile, the portions of the etch barrier layer pattern corresponding to the first region and the third region are not changed in the annealing process and maintain the properties of the original conductive material, improving a contact resistance between the active layer and the source and the drain of the thin film transistor, and increasing the driving capability of the thin film transistor. Therefore, the etch barrier layer material proposed in the present invention replaces the conventional etch barrier layer material, such as silicon oxide (SiOx). As a result, the patterning processes are reduced and the performance of the thin film transistor as a whole is enhanced without affecting the performance of the device.

In an embodiment, the annealing process is performed in the air at a temperature of 200-250° C. for 0.5-3 hours.

If the etch barrier layer is made of tin, during the annealing, the tin (in the second region) exposed in the annealing environment is converted into an insulation Tin oxide (SnOx), so as to prevent the short circuit between the source and the drain. Meanwhile, the tin in the first region and the third region is not changed and has good electrical conductivity, improving the contact resistance between the active layer and the source and the drain of the thin film transistor, and increasing the driving capability of the thin film transistor.

Step 406: depositing a layer of gate insulation material on the substrate, on which the source pattern 5051 and the drain pattern 5052 have been formed, to form a gate insulation layer 506, as shown in FIG. 5(e).

In an embodiment, the gate insulation layer 506 may be deposited by low temperature Chemical Vapor Deposition (CVD), and may be made of silicon dioxide, silicon nitride, silicon oxynitride, etc., or combinations of these materials.

Step 407: depositing a layer of gate material on a surface of the gate insulation layer, and etching the layer of gate material to form a gate pattern 507, as shown in FIG. 5(e);

In an embodiment, the gate material comprises metal, semiconductor material, etc.

Figure 6:
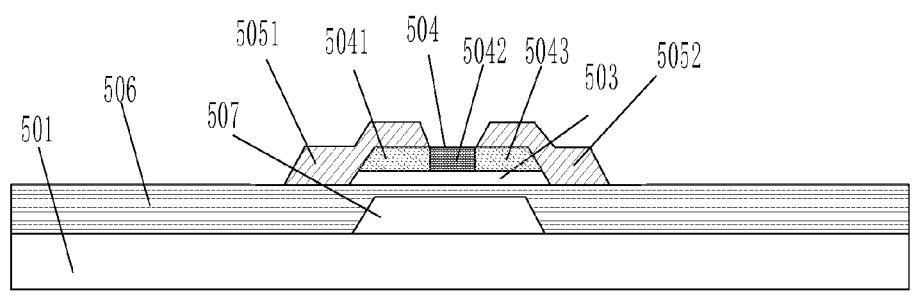
FIG. 6 is an illustrative structural view of a TFT with a bottom gate structure according to an exemplary embodiment of the present invention.

The method of manufacturing the thin film transistor with the bottom gate structure is similar to the method of manufacturing the thin film transistor with the top gate structure, as shown in FIG. 6, the difference between them is in that: firstly, the gate pattern 507 is formed on the substrate 501, then the gate insulation layer 506 is formed on the gate pattern 507, and then the etch barrier material layer 503 is formed on the gate insulation layer 506. Except for these, the subsequent processes are same as the top gate structure, please refer to the descriptions with reference to FIG. 5, and the detailed description of them is omitted herein.

As it is well known in this art, during manufacturing the oxide thin film transistor, after forming the active layer by the oxide semiconductor material, since the oxide semiconductor is sensitive to the metal source and drain etching liquid. Thereby, when etching the metal layer to form the source and the drain, it is necessary to form an etch barrier layer on the active layer so as to prevent the active layer from being corroded. Conventionally, it needs to perform a special patterning process for the etch barrier layer. In contrast, in the method of manufacturing the thin film transistor according to embodiments of the present invention, the etch barrier material layer is made of the conductive material capable of blocking the source and drain etching liquid, and the active material layer and the etch barrier material layer are etched at the same time by a single patterning process, and then after forming the source and the drain, an annealing process is performed, during which the etch barrier layer material, that is, the conductive material, between the source and the drain is combined with oxygen to form a non-conductive insulation material so as to prevent a short circuit between the source and the drain, thus achieving the role of an etch barrier layer. Compared with the prior art, the entire manufacturing process is simplified, and the manufacturing cost is reduced.

Also, in the above method, since the etching process in each of steps and the patterns formed by the etching processes are substantially same as the prior art, the detailed descriptions of them are omitted herein. However, it should be appreciated by those skilled in this art that any other conductive material capable of blocking the source and drain etching liquid and any other solution capable of converting the conductive material in a gap between the source and the drain into the insulation material in the subsequent annealing also all fall within the scope of the present invention.

Embodiments of the present invention also disclose a thin film transistor, as shown in FIG. 5(e) or FIG. 6. FIG. 5(e) shows an illustrative cross section view of a portion of a thin film transistor with a top gate structure, and FIG. 6 shows an illustrative cross section view of a portion of a thin film transistor with a bottom gate structure. The thin film transistor comprises an active layer 503, an etch barrier layer 504, a source 5051 and a drain 5052. The etch barrier layer 504 is located on an upper surface of the active layer 503 and comprises a first region 5041, a second region 5042 and a third region 5043. The etch barrier layer in the first region 5041 and the third region 5043 contains a conductive material capable of blocking a source and drain etching liquid, and the etch barrier layer in the second region 5042 contains an insulation material formed by the conductive material. The source 5051 and the drain 5052 are located in the first region 5041 and the third region 5043 of the etch barrier layer 504, respectively, and the second region 5042 is a region of the etch barrier layer except the first and third regions 5041 and 5043.

In an embodiment, the insulating material is formed by the conductive material by annealing the conductive material.

In an embodiment, the conductive material comprises a metal material, and the insulation material is a metallic oxide by oxidizing the metal material in the annealing.

In an embodiment, the metal material comprises Tin, and the metallic oxide comprises Tin oxide (SnOx).

In an embodiment, the source 5051 and the drain 5052 contact at least a portion of side surfaces of the active layer 503 and the etch barrier layer 504.

In an embodiment, the active layer comprises an oxide semiconductor.

In an embodiment, the thin film transistor is configured to have a top gate structure and further comprises: a buffer layer 502 located below the active layer 503; a gate insulation layer 506 located above the source and the drain 505; and a gate electrode 507 located above the gate insulation layer.

In an embodiment, the thin film transistor is configured to have a bottom gate structure and further comprises: a gate insulation layer 506 located below the active layer 503; and a gate electrode 507 located below the gate insulation layer 506.

The method of manufacturing this thin film transistor corresponds to the method of manufacturing the thin film transistor in the above embodiments, and the detailed description of it is omitted herein.

The thin film transistor according to the embodiments of the present invention has the advantages of having simple production process and low cost.

An embodiment of the present invention also proposes a display substrate comprising the above thin film transistor.

An embodiment of the present invention also proposes a display apparatus comprising the above display substrate.

The display substrate and the display apparatus according to the embodiments of the present invention have the advantages of having simple production process and low cost.

In the method of manufacturing the thin film transistor panel according to the embodiment of the present invention, the active layer material the etch barrier layer material are etched by a single patterning process, and the etch barrier layer is made of the conductive material capable of blocking the source and drain etching liquid, and the conductive material of the etch barrier layer between the source and the drain is combined with oxygen to form a non-conductive insulation material in the subsequent annealing after forming the source and the drain. The formed non-conductive insulation material prevents a short circuit between the source and the drain, achieving the role of a conventional etch barrier layer, effectively simplifying the entire manufacturing process, saving manufacturing procedures, and reducing the manufacturing cost.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

What is claimed is:

1. A method of manufacturing a thin film transistor, comprising steps of:

forming an active material layer on a substrate;

forming an etch barrier material layer on the active material layer, wherein the etch barrier material layer is made of a conductive material capable of blocking a source and drain etching liquid;

forming an active layer pattern and an initial etch barrier layer pattern by performing a single patterning process on the active material layer and the etch barrier material layer, wherein the initial etch barrier layer pattern comprises a first region, a second region and a third region, the first region and the third region being regions for forming a source and a drain, respectively, the second region being a region of the initial etch barrier layer pattern excluding the first and third regions;

forming the source and the drain on the first region and the third region, respectively, by patterning; and converting the conductive material in the second region of the initial etch barrier layer pattern into an insulation material by an annealing process, so as to form a patterned etch barrier layer;

wherein the conductive materials in the first region and the third region remain unchanged and remain conductive during the annealing process.

2. The method according to claim 1, wherein the source and the drain are further formed on at least a portion of side surfaces of the active layer pattern and the initial etch barrier layer pattern.

3. The method according to claim 1, wherein the etch barrier material layer is made of a metal material capable of blocking the source and drain etching liquid, and wherein the metal material in the second region is converted into a metallic oxide after the annealing process.

4. The method according to claim 3, wherein the etch barrier material layer is made of Tin, and the Tin in the second region is converted into a Tin oxide after the annealing process.

5. The method according to claim 1, wherein the annealing process is performed in air at a temperature of 200-250° C. for 0.5-3 hours.

6. The method according to claim 1, wherein the thin film transistor is configured to have a top gate structure, and the method further comprises:

forming a buffer layer on the substrate before forming the active material layer; and forming a gate insulation layer and a gate electrode after forming the source and the drain.

7. The method according to claim 1, wherein the active material layer is made of an oxide semiconductor material.

8. The method according to claim 1, wherein the thin film transistor is configured to have a bottom gate structure, and the method further comprises:

forming a gate electrode and a gate insulation layer in this order on the substrate before forming the active material layer.

* * * * *